US008860499B2

(12) United States Patent
Hayashi et al.

(10) Patent No.: US 8,860,499 B2
(45) Date of Patent: Oct. 14, 2014

(54) SUPPLY VOLTAGE GENERATING CIRCUIT

(71) Applicant: Elpida Memory, Inc., Tokyo (JP)

(72) Inventors: Koichiro Hayashi, Tokyo (JP); Hitoshi Tanaka, Ome (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/912,845

(22) Filed: Jun. 7, 2013

(65) Prior Publication Data

US 2013/0265103 A1    Oct. 10, 2013

Related U.S. Application Data

(63) Continuation of application No. 12/052,422, filed on Mar. 20, 2008, now Pat. No. 8,493,132.

(30) Foreign Application Priority Data

Mar. 27, 2007    (JP) ................................. 2007-081754

(51) Int. Cl.
G05F 1/10 (2006.01)
G11C 5/14 (2006.01)
G05F 1/62 (2006.01)
H02M 3/07 (2006.01)
G11C 11/4074 (2006.01)

(52) U.S. Cl.
CPC *G05F 1/62* (2013.01); *G11C 5/145* (2013.01); *H02M 3/07* (2013.01); *G11C 11/4074* (2013.01)
USPC ........................................................ 327/536

(58) Field of Classification Search
None
See application file for complete search history.

(56) References Cited

U.S. PATENT DOCUMENTS 5,095,223 A * 3/1992 Thomas ........................ 307/110
5,861,973 A   1/1999 Inagaki et al.

(Continued)

FOREIGN PATENT DOCUMENTS

JP    5259289 A    10/1993
JP    11120784 A    4/1999

(Continued)

OTHER PUBLICATIONS

Communication dated Jan. 31, 2012 from the Japanese Patent Office in counterpart Japanese application No. 2007-081754.

(Continued)

Primary Examiner — Lincoln Donovan
Assistant Examiner — Khareem E Almo
(74) Attorney, Agent, or Firm — Sughrue Mion, PLLC

(57) ABSTRACT

A supply voltage generating circuit that enables a reduction in chip area includes: a booster for outputting a boosted voltage upon generating the boosted voltage by charge pumping of a capacitor element; a power-supply step-down unit for stepping down voltage of an external power supply to a voltage within a breakdown-voltage range of the capacitor element, and applying the stepped-down voltage to the power supply of the booster; and a switch element for switching between application of the external power supply to the power supply of the booster directly or via the power-supply step-down unit. The booster comprises multiple stages of booster circuits. The thicknesses of gate oxide films of capacitor elements constituted by MOS transistors included in respective ones of the booster circuits are the same and are made smaller than the thickness of a gate oxide film of a MOS transistor included in a load circuit having the output of the booster at its power supply.

14 Claims, 5 Drawing Sheets

(56) References Cited

U.S. PATENT DOCUMENTS

| | | | |
|---|---|---|---|
| 6,075,403 | A | 6/2000 | Ishikawa et al. |
| 6,218,818 | B1 | 4/2001 | Kim |
| 6,504,422 | B1 | 1/2003 | Rader et al. |
| 6,859,091 | B1 | 2/2005 | Nicholson et al. |
| 7,288,984 | B2 | 10/2007 | Armaroli et al. |
| 2003/0048524 | A1 | 3/2003 | Chavez-Pirson et al. |
| 2003/0169489 | A1 | 9/2003 | Jiang et al. |
| 2004/0017241 | A1 | 1/2004 | Saeki |
| 2004/0155698 | A1 | 8/2004 | Kimura |
| 2005/0047180 | A1* | 3/2005 | Kim .............................. 363/59 |
| 2005/0189983 | A1 | 9/2005 | Sivero et al. |
| 2005/0219878 | A1 | 10/2005 | Ito et al. |
| 2006/0186948 | A1 | 8/2006 | Kelly et al. |
| 2006/0187540 | A1 | 8/2006 | Andrejco et al. |
| 2007/0024341 | A1 | 2/2007 | Muggler et al. |
| 2007/0139982 | A1 | 6/2007 | Ueno et al. |
| 2007/0210774 | A1 | 9/2007 | Kimura et al. |
| 2008/0094128 | A1 | 4/2008 | Ito et al. |

FOREIGN PATENT DOCUMENTS

| | | |
|---|---|---|
| JP | 2002237185 A | 8/2002 |
| JP | 2003249076 A | 9/2003 |
| JP | 200511475 A | 1/2005 |
| JP | 2005-158098 A | 6/2005 |

OTHER PUBLICATIONS

Non-final Office Action issued Aug. 6, 2009 in Parent U.S. Appl. No. 12/052,422.

Non-final Office Action issued Feb. 4, 2011 in Parent U.S. Appl. No. 12/052,422.

Non-final Office Action issued Nov. 8, 2012 in Parent U.S. Appl. No. 12/052,422.

Final Office Action issued Mar. 11, 2011 in Parent U.S. Appl. No. 12/052,422.

Final Office Action issued Aug. 9, 2010 in Parent U.S. Appl. No. 12/052,422.

Final Office Action issued Aug. 1, 2011 in Parent U.S. Appl. No. 12/052,422.

Advisory Action issued Jun. 25, 2010 in Parent U.S. Appl. No. 12/052,422.

Advisory Action issued Dec. 22, 2011 in Parent U.S. Appl. No. 12/052,422.

Notice of Allowance issued Mar. 22, 2013 in Parent U.S. Appl. No. 12/052,422.

* cited by examiner

SUPPLY VOLTAGE GENERATING CIRCUIT

CROSS-REFERENCE TO RELATED APPLICATIONS

This application is a Continuation Application of U.S. application Ser. No. 12/052,422 filed Mar. 20, 2008, which claims the benefit of the priority of Japanese patent application No. 2007-081754, filed on Mar. 27, 2007, the disclosures of which are incorporated herein in their entirety by reference thereto.

FIELD OF THE INVENTION

This invention relates to a supply voltage generating circuit and, more particularly, to a supply voltage generating circuit for generating a boosted voltage within a semiconductor storage device.

BACKGROUND OF THE INVENTION

If specifications relating to a DRAM are changed or the specifications have not been fully decided, there are cases where the supply voltage supplied from the outside in accordance with a request from the user differs. A supply voltage supply circuit for driving a word line is one circuit for which different supply voltages are required of externally applied power. Designing such a supply voltage supply circuit involves preparing a plurality of types of transistors having oxide-film thicknesses for which circuit operation is optimum, and designing the circuit based upon the plurality of types of transistors. If a booster circuit is designed assuming a case where the power supplied will differ depending upon the specifications, the problem of oxide-film withstand voltage and a current-consumption problem ascribable to gate leakage must be taken into account. If, in order to avoid these problems, a transistor for thick-film capacitance is used in the circuit in accordance with the higher voltage among voltages that have been set depending upon specifications, there is the danger that this will result in a booster circuit of larger area.

Patent Document 1 describes a supply voltage generating circuit in which capacitors having different film thicknesses are used selectively in dependence upon the operating supply voltage, thereby reducing circuit layout area and generating a stable supply voltage. This supply voltage generating circuit is one that boosts the operating supply voltage of the device and outputs the boosted voltage and has a first capacitor made of a thick insulating film, a second capacitor made of a thin gate insulating film, and a switch circuit for changing the circuit connections of the first and second capacitors in accordance with the operating supply voltage.

[Patent Document 1]
Japanese patent Kokai Publication No. JP-P2005-158098A

SUMMARY OF THE DISCLOSURE

The following analyses are given by the present invention. The entire disclosure of the above mentioned patent document is incorporated herein by reference thereto.

The booster of the supply voltage generating circuit has a boosting pump capacitor element that utilizes the oxide-film capacitance of a transistor. There are many cases where the boosting capacitor element requires a very large capacitance. This necessitates a large area and has a major impact upon the area of the overall chip. Since the capacitance of the oxide film is inversely proportional to the thickness of the oxide film, usually use of a thin-film capacitor element (thin-film transistor) is desired. However, in a case where the supply voltage supplied from the outside differs depending upon the specifications, as mentioned above, a thick-film transistor usually is used as the boosting capacitor element in order that the supply voltage supplied will not exceed the breakdown (or withstand) voltage of a thin-film transistor. Normally the value of a voltage for driving a word line will exhibit almost no change even if the supply voltage supplied from the outside changes. Accordingly, regardless of the fact that the lower the external supply voltage, the greater the number of pump capacitor elements required, a thick film having little capacitance must be used even in a case where voltage is low because of the breakdown voltage of the oxide film. Thus, with the conventional circuitry, the design must be such that transistor breakdown voltage will be in conformity with the high side of the external supply voltage. Consequently, part of the booster capacitance in the booster circuit, e.g., the first capacitor in Patent Document 1, must be made a thick-film capacitor element and, hence, the degree to which chip area can be reduced is limited.

Accordingly, it is an object of the present invention to provide a supply voltage generating circuit of smaller chip area.

According to a first aspect of the present invention, there is provided a supply voltage generating circuit comprising: a booster that outputs a boosted voltage upon generating the boosted voltage by charge pumping of a capacitor element. There is a power-supply step-down unit that steps down voltage of an external power supply to a voltage within a breakdown-voltage range of the capacitor element, and applies the stepped-down voltage to the power supply of the booster. There is a switch circuit group that switches between application of the external power supply to the power supply of the booster directly or via the power-supply step-down unit.

Preferably, in the supply voltage generating circuit of the present invention, the capacitor element is constituted by a MOS transistor having a gate oxide film, and the thickness of the gate oxide film is made less than thickness of a gate oxide film of a MOS transistor included in a load circuit having the output of the booster as its power supply.

Preferably, in the supply voltage generating circuit of the present invention, the booster comprises multiple stages of booster circuits, and thicknesses of gate oxide films of capacitor elements constituted by MOS transistors included in respective ones of the booster circuits are the same.

Preferably, in the supply voltage generating circuit of the present invention, the booster is so adapted that the number of booster stages in the multiple stages of booster circuits is changed over by the switch circuit group in accordance with the power-supply voltage applied to the booster.

Preferably, in the supply voltage generating circuit of the present invention, the booster includes a pre-stage booster circuit and a post-stage booster circuit; the pre-stage booster circuit generates a first boosted signal having an amplitude between ground potential and a potential that is double the potential of the external power supply; the post-stage booster circuit receives, as an input, the first boosted signal or a second boosted signal having an amplitude between ground potential and the output potential of the power-supply step-down unit; and the switch circuit group has a first switch element for switching a connection destination of the power supply of the booster to the external power supply or to the output of the power-supply step-down unit, and a second switch element for switching a connection destination of the input of the post-stage booster circuit to the first or second boosted signal; wherein the second switch element is switched to the first boosted signal when the first switch element has been switched to the external power supply, and the second switch element is switched to the second boosted signal when the first switch element has been switched to the output of the power-supply step-down unit.

Preferably, in the supply voltage generating circuit of the present invention, it is so arranged that a capacitor element that has become unnecessary for the boosting operation in the multiple stages of booster circuits owing to switching by the switch circuit group in accordance with the power-supply voltage applied to the booster is connected by the switch circuit group and made to function as a capacitor element for stabilizing the output of the power-supply step-down unit.

Preferably, in the supply voltage generating circuit of the present invention, the switch circuit group is controlled by any of a metal option, fuse option and bonding option.

In a second aspect of the present invention, there is provided a semiconductor storage device comprising the supply voltage generating circuit, and a load circuit having the output of the booster as its power supply.

The meritorious effects of the present invention are summarized as follows.

In accordance with the present invention, the voltage of the external power supply is stepped down to a voltage within the breakdown-voltage range of the capacitor element and is supplied to the booster in a case where the voltage of the external power supply exceeds the breakdown voltage of the capacitor element. As a result, thin-film capacitor elements can be used for all of the capacitor elements in the booster. This makes it possible to reduce chip area.

Other features and advantages of the present invention will be apparent from the following description taken in conjunction with the accompanying drawings, in which like reference characters designate the same or similar parts throughout the figures thereof.

PREFERRED MODES OF THE INVENTION

A preferred exemplary embodiment of the present invention will now be described in detail with reference to the accompanying drawings.

Figure 1:
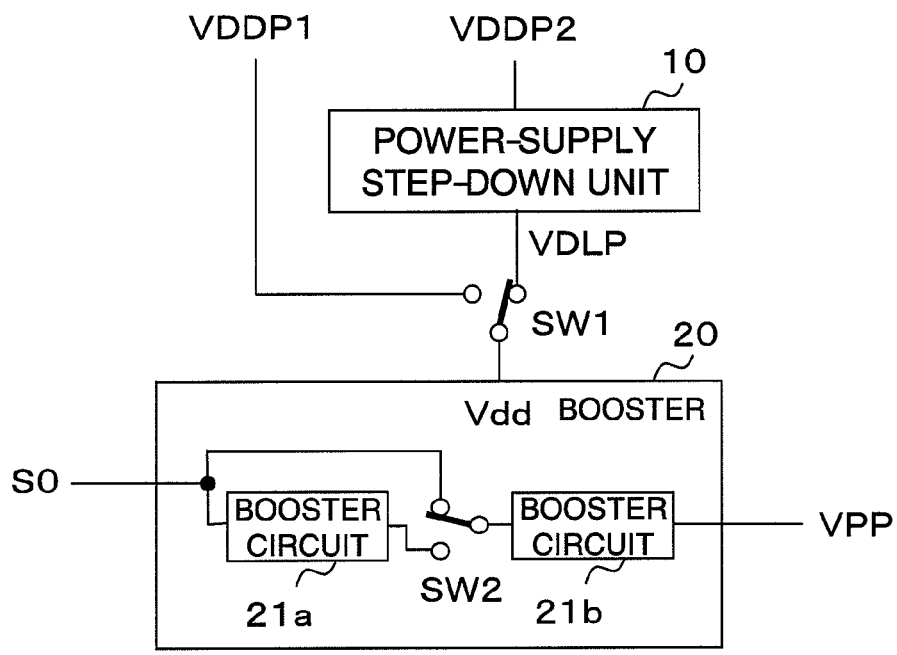
FIG. 1 is a block diagram illustrating the configuration of a supply voltage generating circuit according to an exemplary embodiment of the present invention.

FIG. 1 is a block diagram illustrating the configuration of a supply voltage generating circuit according to an exemplary embodiment of the present invention. As shown in FIG. 1, the supply voltage generating circuit includes a power-supply step-down unit 10, a booster 20 and a switch element SW1.

The booster 20 generates a boosted voltage by the charge pumping of capacitor elements and outputs the boosted voltage generated. In a case where the voltage of an external power supply exceeds the breakdown voltage of the capacitor elements, the power-supply step-down unit 10 steps down the external supply voltage to a voltage within the range of breakdown voltage of the capacitor elements and applies the stepped-down voltage to the power supply of the booster 20. The switch element SW1 switches between application of the external power supply to the power supply of the booster 20 directly or via the power-supply step-down unit 10.

The capacitor elements in the booster 20 are constituted by MOS transistors. Preferably, the thickness of the gate oxide film of each MOS transistor is made less than the thickness of a gate oxide film of a MOS transistor included in a load circuit having the output VPP (FIG. 1) of the booster 20 as its power supply. An example of the load circuit is a circuit for driving a word line.

Preferably, the booster 20 comprises multiple booster circuits 21a and 21b, and the thicknesses of gate oxide films of the capacitor elements constituted by the MOS transistors included in respective ones of the booster circuits are the same.

Preferably, the booster 20 is so adapted that the number of booster stages (e.g., one stage or two stages) constituted by the multiple booster circuits 21a, 21b is changed over by a switch element SW2 in accordance with the power-supply voltage applied to the booster 20.

It may be so arranged that a semiconductor storage device typified by a DRAM, particularly a DDR-SDRAM, includes a supply voltage generating circuit having the above-described configuration, and a load circuit (not shown) the power supply of which is the output of the booster 20. An example of the load circuit is a circuit for driving a word line.

In accordance with the supply voltage generating circuit having the above-described configuration, the voltage of the external power supply is stepped down by the power-supply step-down unit 10 in a case where the external supply voltage is so high as to exceed the breakdown voltage of the capacitor elements (thin-film transistors). This is based upon the condition that the external supply voltage will differ depending upon the specifications. It is possible for thin-film capacitor elements having a large capacitance to be used in the booster 20 and to be used conjointly also in a case where the supply voltage is low. Accordingly, layout area in the chip can be reduced by a wide margin. Now an exemplary embodiment of the present invention will be described in detail.

[Exemplary Embodiment]

FIG. 1 is a block diagram illustrating a supply voltage generating circuit according to an exemplary embodiment of the present invention. As shown in FIG. 1, the supply voltage generating circuit includes the power-supply step-down unit 10, booster 20 and switch element SW1, which is of single-pole, double-throw type. The switch element SW1 switches between application of the voltage of an external power supply VDDP1 to power supply Vdd of the booster 20 directly or as power supply VDLP following stepping down of the voltage of an external power supply VDDP2 by the power-supply step-down unit 10.

The booster 20 includes a pre-stage booster circuit 21a, a post-stage booster circuit 21b, and single-pole, double-throw switch element SW2 for switching between the booster circuits 21a and 21b. The booster 20 generates a boosted voltage from power supply Vdd by charge pumping of the capacitor elements using a driving signal S0, and supplies the boosted voltage to a load circuit, an example of which is a circuit for driving a word line, as power supply VPP. At this time the switch element SW2 changes over the number of booster stages in the booster 20 to one stage, namely the booster circuit 21b, or to two stages, namely the booster circuits 21a and 21b.

The booster circuit 21a receives the driving signal S0 as an input and outputs a signal (a first boosted signal) having an amplitude between ground potential and a potential that is double the potential of the external power supply VDDP1. Further, the booster circuit 21b receives a signal (a second boosted signal) having an amplitude between ground potential and the potential of power supply VDLP, or the output signal (the first boosted signal) of the booster circuit 21a, as an input, boosts the signal and outputs the boosted signal as power supply VPP. The switch element SW2 is switched to the first boosted signal when the switch element SW1 has been switched to the external power supply VDDP1, and the switch element SW2 is switched to the second boosted signal when the switch element SW1 has been switched to the output (VDLP) of the power-supply step-down unit 10.

Figure 2:
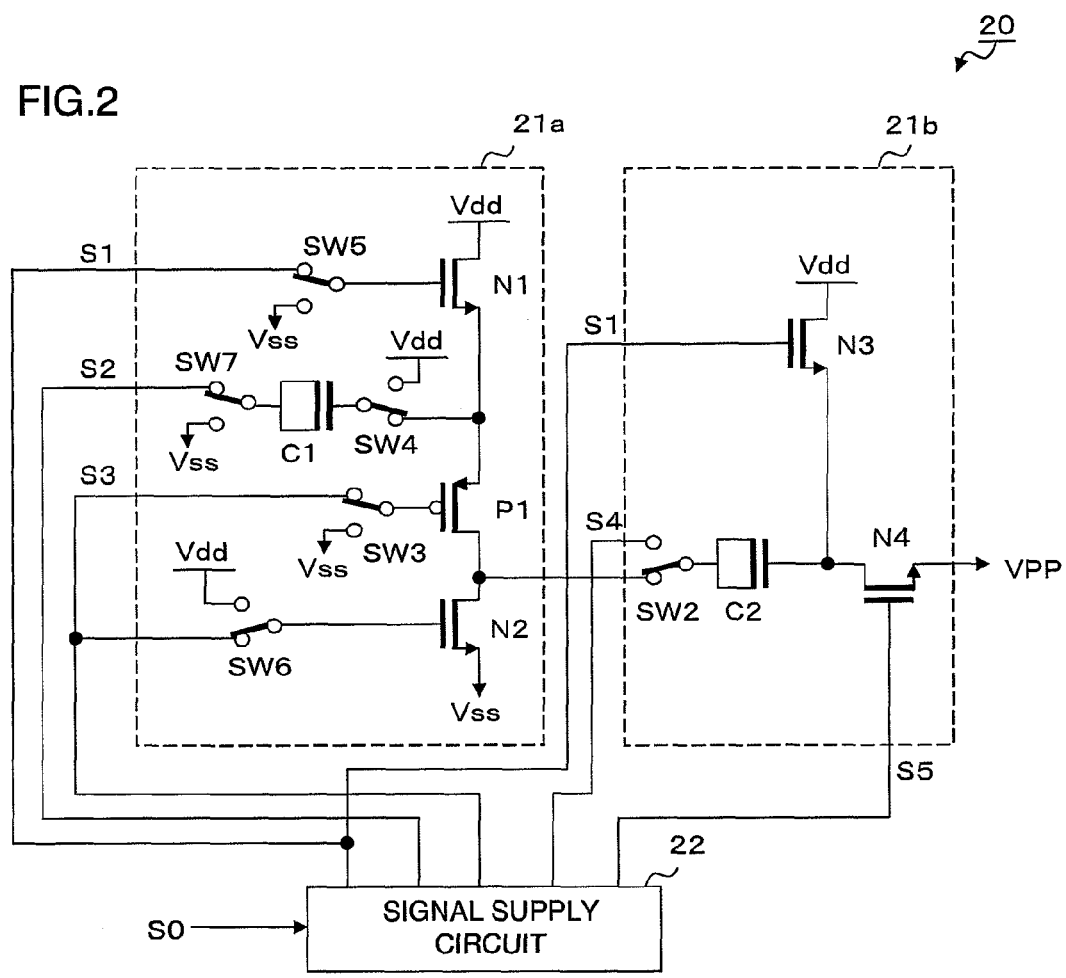
FIG. 2 is a circuit diagram of a booster according to an exemplary embodiment of the present invention.

The details of the booster 20 will be described next. FIG. 2 is a circuit diagram of the booster according to this exemplary embodiment of the present invention. As shown in FIG. 2, the booster 20 includes the booster circuits 21a, 21b and a signal supply circuit 22 to which the signal S0 is input and which outputs signals S1 to S5. The booster circuit 21a has N-channel transistors N1, N2, a P-channel transistor P1, a capacitor element C1 constituted by a MOS transistor, and single-pole, double-throw switch elements SW3 to SW7. The booster circuit 21b has N-channel transistors N3, N4, a capacitor element C2 constituted by a MOS transistor, and the switch element SW2. The N-channel transistor N1 and capacitor elements C1, C2 are transistors (thin-film transistors) each having a thick gate insulating film. The N-channel transistors N2 to N4 and the P-channel transistor P1 are transistors (thick-film transistor) each having a thick gate insulating film. Furthermore, the switches SW1 to SW7 are controlled by a changeover switch-option signal according to any of a metal option, fuse option or bonding option.

The N-channel transistor N1 has a drain connected to the power supply Vdd, a source connected to one end of the switch element SW4, the other end of which is connected to the power supply Vdd, and to the source of the P-channel transistor P1, and a gate connected to the contact on the single-pole side of the switch element SW5. The P-channel transistor P1 has a drain connected to the drain of the N-channel transistor N2 and to one end of the switch element SW2, and a gate connected to the contact on the single-pole side of the switch element SW3. The N-channel transistor N2 has a source connected to power supply Vss (ground) and a gate connected to the single-pole side of the switch element SW6. The capacitor element C1 has one end connected to the contact on the single-pole side of the switch element SW4, and its other end connected to the contact on the single-pole side of the switch element SW7. The signal S3 is applied to one end of the switch element SW3, the other end of which is connected to the power supply Vss. The signal S1 is applied to one end of the switch element SW5, the other end of which is connected to the power supply Vss. The signal S2 is applied to one end of the switch element SW7, the other end of which is connected to the power supply Vss. The signal S3 is applied to one end of the switch element SW6, the other end of which is connected to the power supply Vdd.

The N-channel transistor N3 has a drain connected to the power supply Vdd, a source connected to one end of the capacitor element C2 and to the drain of the N-channel transistor N4, and a gate to which the signal Si is applied. The N-channel transistor N4 has a source connected as the power supply VPP and a gate to which the signal S5 is applied. The capacitor element C2 has its other end connected to the contact on the single-pole side of the switch element SW2. The signal S4 is applied to the other end of the switch element SW2.

Figure 3A:
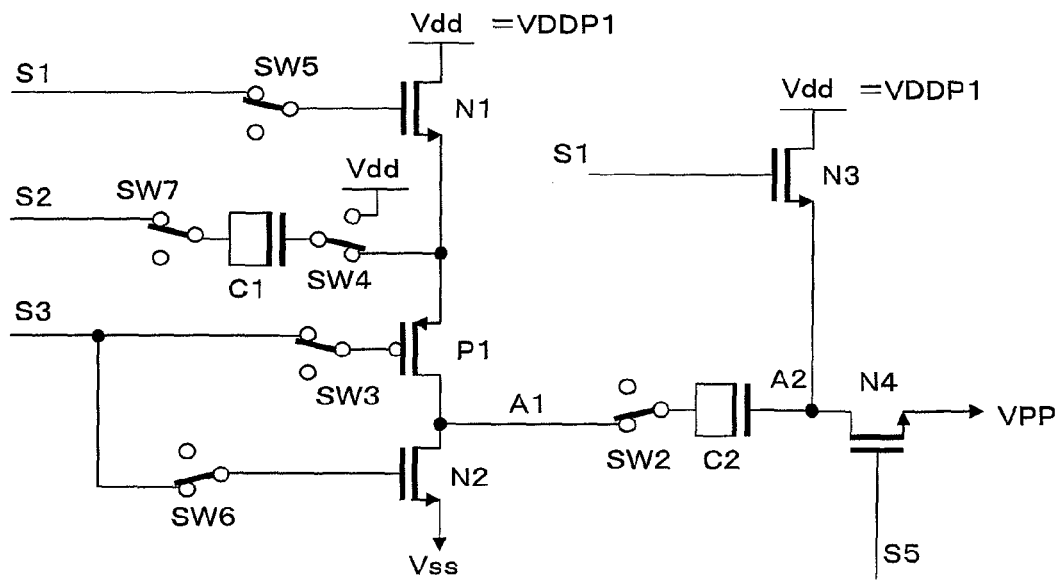
FIG. 3A is an equivalent circuit in a case where the booster performs a two-stage operation.
Figure 4A:
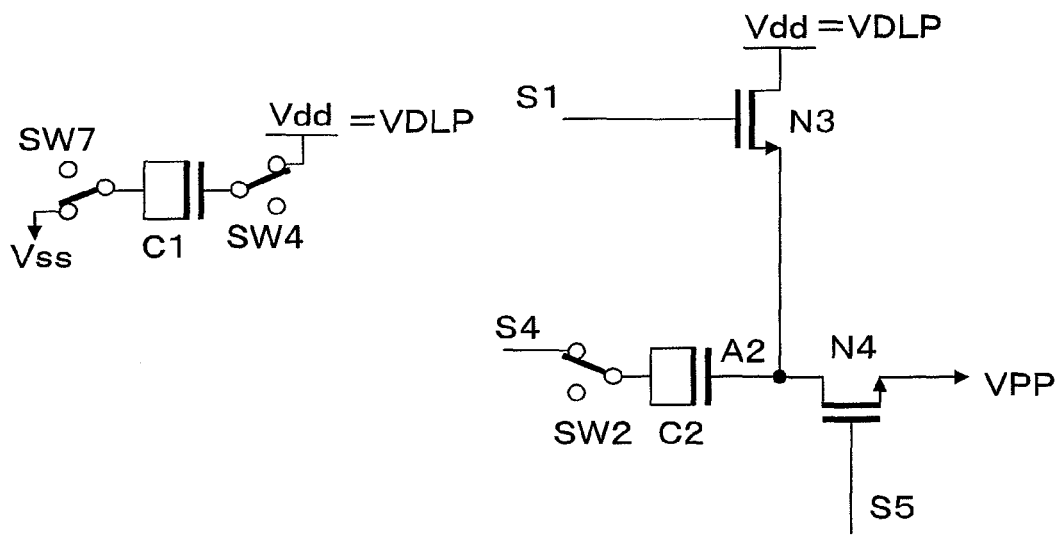
FIG. 4A is an equivalent circuit in a case where the booster performs a single-stage operation.

Described next will be operation of the booster circuits when the switches SW2 to SW7 in FIG. 2 are changed over in operative association with the switch element SW1 in FIG. 1. FIG. 3A illustrates the connections in a case where the voltage of the external power supply VDDP1 is lower than the thin-film transistor breakdown voltage, and FIG. 4A illustrates the connections in a case where the voltage of the external power supply VDDP2 is higher than the thin-film transistor breakdown voltage. It should be noted that the power supplies and the voltage values of these power supplies will be represented by the same reference characters. VDDP1 indicates external supply voltage that is lower than the thin-film transistor breakdown voltage, VDDP2 indicates external supply voltage that is higher than the thin-film transistor breakdown voltage, VPP indicates supply voltage for driving a word line, and VDLP indicates supply voltage obtained by stepping down VDDP2 to the range of the thin-film transistor breakdown voltage by the power-supply step-down unit 10. That is, it is assumed that the allowable range of thin-film breakdown voltage is less than VDLP and that the allowable range of thick-film breakdown voltage is less than VPP. The relationships among these supply voltages are as follows for the sake of simplicity: VPP>VDDP2>VDLP>VDDP1, 2·VDLP>VPP, 3·VDP1>V, VPP>2·VDDP1.

Figure 3B:
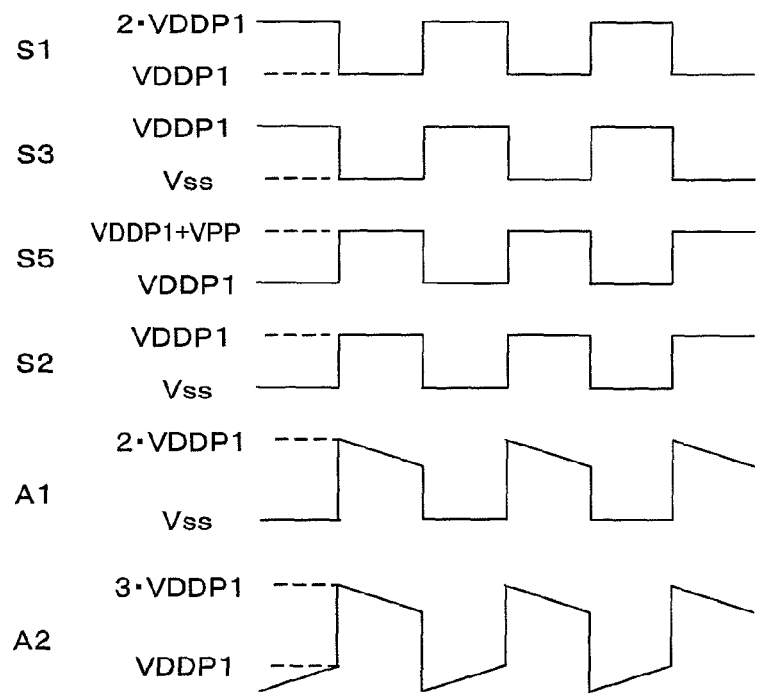
FIG. 3B is a timing chart illustrating the waveforms of signals associated with the equivalent circuit.

FIG. 3A is an equivalent circuit in a case where the booster performs a two-stage operation, and FIG. 3B is a timing chart illustrating the waveforms of signals associated with the equivalent circuit. More specifically, FIG. 3A illustrates an equivalent circuit relating to the connections of the booster 20 in a case where the voltage of the external power supply VDDP1 is lower than the thin-film transistor breakdown voltage. FIG. 3B is a timing chart of the associated signals.

(1) When the voltage level of the signal S1 is 2·VDDP1, the N-channel transistor N1 to the gate of which the signal S1 is applied turns on and the source of the N-channel transistor N1, namely one end of the capacitor element C1, is charged toward VDDP1. Since the voltage level of the signal S3 is VDDP1 at this time, the P-channel transistor P1 if off and has no effect upon the charging operation of the capacitor element C1. It should be noted that the voltage level of the signal S2 is Vss. Accordingly, the capacitor element C1 is charged by the potential VDDP1−Vss.

On the other hand, since the voltage level of the signal S1 is 2·VDDP1, the N-channel transistor N3 turns on and contact A2, which is the source of the N-channel transistor N3, namely one end of the capacitor element C2, is charged toward VDDP1. Since the voltage level of the signal S3 is VDDP1 at this time, the N-channel transistor N2 is on and the potential at the other end of the capacitor element C2 is Vss.

(2) If the voltage level of the signal S1 becomes VDDP1, then the voltage level of the signal S2 rises from Vss to VDDP1 and this is accompanied by a rise in the potential at the source of the N-channel transistor N1, namely at one end of the capacitor element C1, from VDDP1 to 2·VDDP1. The N-channel transistor N1 turns off and has no effect upon the potential elevating operation. Since the voltage level of the signal S3 is Vss at this time, the P-channel transistor P1 is on and the N-channel transistor N2 is off. Accordingly, the potential at one end of the capacitor element C1 is transmitted to the other end of the capacitor element C2 as the potential at contact (node) A1.

As a result, the potential at one end of the capacitor element C2 rises from VDDP1 to 3·VDDP1. Since the voltage level of the signal S1 is VDDP1 at this time, the N-channel transistor N3 is off and has no effect upon the potential elevating operation. Further, since the voltage level of the signal S5 is VDDP1+VPP, the N-channel transistor N4 turns on and the potential at one end of the capacitor element C2, namely at contact (node) A2, is transmitted to VPP. By supplying the electric charge that has accumulated by charging in the capacitor element C2 to the outside, the potential at contact A2 gradually declines.

The booster 20 supplies VPP with a voltage close to 2·VDDP1 by the operation described above. At this time, the locations at which the thin-film transistors of the capacitor elements C1 and C2, etc. are formed in the booster 20 are always subjected to only a difference potential of not more than VDDP1 across the gate and source or across the gate and drain.

Figure 4B:
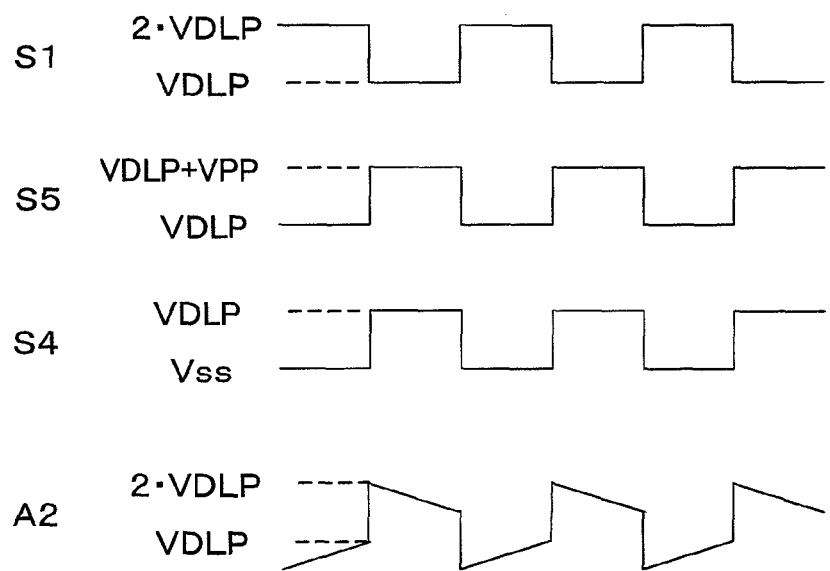
FIG. 4B is a timing chart illustrating the waveforms of signals associated with the equivalent circuit.

FIG. 4A is an equivalent circuit in a case where the booster performs a single-stage operation, and FIG. 4B is a timing chart illustrating the waveforms of signals associated with the equivalent circuit. More specifically, FIG. 4A illustrates an equivalent circuit relating to the connections of the booster 20 in a case where the voltage of the external power supply VDDP2 is higher than the thin-film transistor breakdown voltage. In this case, VDDP2 is stepped down to VDLP by the power-supply step-down unit 10 and VDLP is applied as the power supply Vdd of the booster 20.

In FIG. 2, the N-channel transistor N1, which has its gate connected to Vss, is turned off. Further, the N-channel transistor N2, which has its gate connected to Vdd, turns on, and so does the P-channel transistor P1, which has its gate connected to Vss. Accordingly, the N-channel transistors N1, N2 and P-channel transistor P1, which have been isolated from the boosting operation, have no effect upon the other circuits.

On the other hand, as illustrated in FIG. 4A, one end of the capacitor element C1 is connected to the power supply Vdd, namely to the power supply VDLP which is the result or step-down by the power-supply step-down unit 10, and the other end of the capacitor element is connected to Vss. Accordingly, the capacitor element C1 functions as a stabilizing capacitance between Vdd/Vss in the booster 20.

FIG. 4B is a timing chart of signals associated with FIG. 4A.

(1) When the voltage level of the signal S1 is 2·VDDP1, the N-channel transistor N3 to the gate of which the signal S1 is applied turns on and the source of the N-channel transistor N3, namely one end of the capacitor element C2, is charged toward VDLP. The other end of the capacitor element C2 is made Vss by the signal S4.

(2) If the voltage level of the signal Si becomes VDLP, then the voltage level of the signal S4 rises from Vss to VDLP and the potential at contact A2, namely at one end of the capacitor element C2, rises from VDLP to 2·VDLP. Since the voltage level of the signal S1 is VDLP at this time, the N-channel transistor N3 is off and has no effect upon the potential elevating operation. Further, since the voltage level of the signal S5 is VDLP+VPP, the N-channel transistor N4 turns on and the potential at one end of the capacitor element C2, namely at contact A2, is transmitted to VPP. By supplying the electric charge that has accumulated by charging in the capacitor element C2 to the outside, the potential at contact A2 gradually declines.

The locations (portions) at which the thin-film transistors of the capacitor elements C1 and C2, etc. are formed in the booster 20 which operates as set forth above are always subjected to only a difference potential of not more than VDDP1 across the gate and source or across the gate and drain.

In a case where the external supply voltage is VDDP2 in the booster 20 constructed as described above, the configuration is made one in which the number of booster stages is made a single stage.

This is because 2·VDLP is somewhat larger than VPP and the single-stage configuration is better than the two-stage configuration in that current consumption declines and a power supply at the VPP level is capable of being provided. The reason for this is that although the contacts A1 and A2 in FIG. 3A should ideally take on potentials of 2·VDDP1 3·VDDP1, respectively, in actuality the ideal potentials are not attained owing to the influence of parasitic capacitance. Accordingly, it is preferred in terms of obtaining good voltage conversion efficiency that the number of stages be made as small as possible so as to eliminate the influence of parasitic capacitance. Further, the two-stage configuration is not preferred over the one-stage configuration since current consumption increases by an amount commensurate with the increased number of operating contacts.

Figure 5:
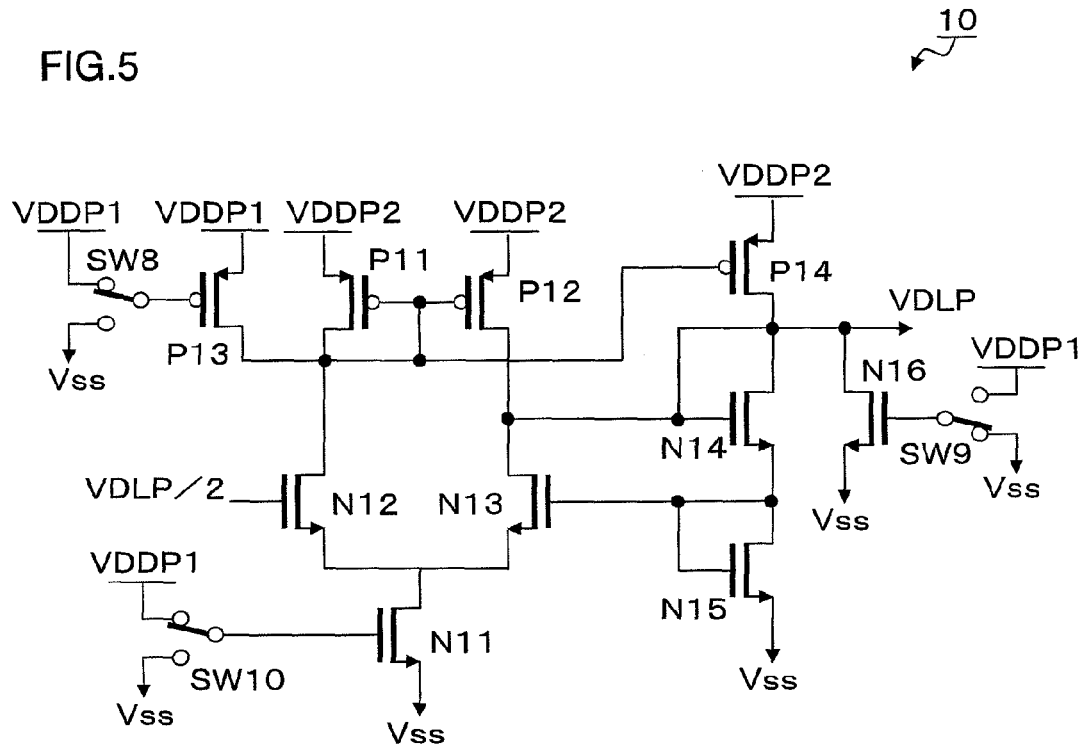
FIG. 5 is a circuit diagram of a power-supply step-down unit.

FIG. 5 is a circuit diagram of the power-supply step-down unit 10. The power-supply step-down unit 10 is a circuit for performing driving by stepping down VDDP2 and bringing the power-supply voltage of VDLP/2, which has been generated within the DRAM, etc., to the VDLP level. The power-supply step-down unit 10 has N-channel transistors N11 to N16, P-channel transistors P11 to P14 and switch elements SW8 to SW10. The N-channel transistors N12 and N13, which form a differential pair, have their sources tied together and connected to the N-channel transistor N11 serving as a current source, and have their drains connected respectively to the P-channel transistors P11, P12, which construct a current mirror. Further, VDLP/2 is applied to the gate of the N-channel transistor N12, and the gate of N-channel transistor N13 is connected to the middle point of a series circuit comprising diode-connected N-channel transistors N14 and N15. The drain of the N-channel transistor N12 is connected to the gate of the P-channel transistor P14, whose source is connected to VDDP2. Furthermore, the drain of the P-channel transistor P14 supplies the booster 20 with VDLP as the output of the power-supply step-down unit 10 and is connected to the anode (drain and gate) of the N-channel transistor N14. The N-channel transistor N14 has its source connected to Vss.

It should be noted that in a case where the step-down function of the power-supply step-down unit 10 is not used, the switch elements SW8 to SW10 shown in FIG. 5 are changed over so as not to actuate the power-supply step-down unit 10. That is, the gate of the P-channel transistor P13 becomes Vss, and P-channel transistor P13 turns on and the P-channel transistors P11, P12, P14 are turned off. Further, the gate of the N-channel transistor N11 becomes Vss, the N-channel transistor N11 turns off and supply of current to the N-channel transistors N12, N13 is halted. Furthermore, the gate of the N-channel transistor N16 becomes VDDP1, the N-channel transistor N16 turns on and VDLP is held at the level of Vss.

The circuit of the power-supply step-down unit 10 is composed entirely of thick-film transistors since VDDP2, which exceeds the thin-film transistor breakdown voltage, is input to the circuit. In a case where VDDP1 is input as the external supply voltage, the switch elements SW8 to SW10 are changed over to deactivate the step-down function. It should be noted that the power-supply step-down unit 10 illustrated in FIG. 5 is one example and it is not necessarily required that the unit have a circuit configuration identical with that illustrated. Another circuit configuration may be adopted so long as it is one in which a power-supply voltage at the VDLP level is output from VDDP2.

In accordance with the supply voltage generating circuit having the configuration described above, if external supply voltage exceeds the thin-film transistor breakdown voltage, then voltage is stepped down to a voltage within the breakdown-voltage range of the thin-film transistors and the supply voltage for driving a word line is boosted by the booster 20 composed of thin-film transistors. Accordingly, even in a case where the external supply voltage is so high as to exceed the thin-film transistor breakdown voltage, it is possible for thin-film capacitor elements (transistors for thin-film capacitance) having a large capacitance to be used in the booster 20, which is for driving a word line, and to be used conjointly also in a case where the supply voltage is low. Chip area can be reduced by constructing the booster 20 entirely of thin-film capacitor elements.

Next, the invention will be described using specific numerical values. Assume that the following values hold: VPP=2.5 V, VDDP2=1.8 V, VDLP=1.5 V, VDDP1=1.2 V, thin-film transistor breakdown voltage=1.5 V, and thick-film transistor breakdown voltage=3.0 V. The thick-film transistor breakdown voltage is double the thin-film transistor breakdown voltage. In relation to the thickness of an oxide film, therefore, usually the thick film has twice the thickness of the thin film and, hence, the capacitance of the thick film is half that of the thin film. The transistor area is decided assuming a case where VDDP1=1.2 V holds, which is the worst condition in terms of VPP supply capability. If thick-film capacitor elements are used, however, an area that is twice that for thin-film capacitor elements is required. The area of a pump capacitor element in a DRAM often is made several square millimeters. If area is halved, therefore, this is considerably beneficial in reducing chip area. It should be noted that chip area that corresponds to the power-supply step-down unit is increased by providing the supply voltage generating circuit with the power-supply step-down unit. In comparison with the area of the pump capacitor element, however, the area of the power-supply step-down unit is small enough to be negligible (the VDLP stabilizing capacitance need not be increased).

In accordance with the supply voltage generating circuit of this exemplary embodiment, it is possible to adopt an arrangement in which the number of booster stages is changed over to the most efficient number depending upon the level of the external voltage by changing over the number of booster stages of the supply boosting circuitry for word-line drive by any of a metal option, fuse option or bonding option.

This will be described in detail under conditions identical with those described earlier. In order to simply obtain VPP=2.5 V, if the external supply voltage is VDDP1=1.2 V, then boosting to 3·VDDP1=3.6 V must be performed and two-stage boosting is performed. By contrast, if VDDP2=1.8 V holds, then 2·VDLP=3.0 V holds at VDLP=1.5 V and performance with regard to supplying VPP with power is good. This means that single-stage boosting suffices. The smaller the number of stages, the better the efficiency at which VPP is supplied with power.

In the scheme described above, the booster circuits are switched between one and two stages depending upon the external supply voltage. However, the present invention is applicable also to a case where changeover between other numbers of stages becomes effective depending upon the value of VPP with respect to the external supply voltage. For example, the invention may be applied to changeover between two and three stages or between three and four stages, etc. Further, in extreme cases, the invention is applicable to changeover between one and three stages, etc. Furthermore, a case is conceivable in which external supply voltage does not exceed the thin-film transistor breakdown voltage and single-stage boosting is enough to supply power to VPP. Even in this case, however, the supply voltage generating circuit of this exemplary embodiment can be applied.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   first and second voltage terminals to be respectively supplied with first and second voltages different from each other;
   an internal voltage node;
   a switching circuit coupled between the first and second voltage terminals and the internal voltage node, the switching circuit to take either one of a first switching state in which the first voltage terminal and the internal voltage node are connected and a second switching state in which the second voltage terminal and the internal voltage node are connected; and
   a voltage booster circuit including a voltage output node and first and second boosting circuits each including a capacitor and each coupled to the internal voltage node, the voltage booster circuit being configured such that the first and second voltage boosting circuits are coupled in series to the voltage output node when the switching circuit takes the first switching state and that the first boosting circuit is coupled to the voltage output node and the second boosting circuit is disconnected from each of the first boosting circuit and the voltage output node when the switching circuit takes the second switching state, and
   at least when the switching circuit takes a switching state, the capacitor of the first boosting circuit is coupled to the voltage output node and the capacitor of the second boosting circuit is disconnected from each of the voltage output node and the capacitor of the first boosting circuit.

2. The semiconductor device as claimed in claim 1, further comprising a first external voltage terminal to be supplied with the first voltage, the first external voltage terminal coupled to the first voltage terminal.

3. The semiconductor device as claimed in claim 2, further comprising a second external voltage terminal to be supplied with a third voltage and an internal voltage generator coupled to the second external voltage terminal to also be supplied with the third voltage and configured to generate the second voltage at the second voltage terminal.

4. The semiconductor device as claimed in claim 3, wherein the third voltage is greater than the first voltage.

5. The semiconductor device as claimed in claim 4, wherein the third voltage is greater than the second voltage.

6. The semiconductor device as claimed in claim 1, wherein the second boosting circuit is configured to boost the first voltage supplied with the internal voltage node to generate a first boosting voltage and the first boosting circuit is configured to boost the first boosting voltage to generate at the voltage output node a second boosting voltage when the switching circuit takes the first switching state.

7. The semiconductor device as claimed in claim 6, wherein the first boosting circuit is configured to boost the second voltage supplied with the internal voltage node to generate at the voltage output node a third boosting voltage when the switching circuit takes the second switching state.

8. A method for generating a supply voltage, comprising:
providing, from a first voltage terminal and a second voltage terminal, first voltage and second voltage different from each other;
selecting, by a switching circuit coupled between the first voltage terminal and the second voltage terminal, either one of a first switching state in which the first voltage terminal and an internal voltage node are connected and a second switching state in which the second voltage terminal and the internal voltage node are connected; and
outputting, by a voltage booster circuit including first boosting circuit and second boosting circuit, either one of a first boosted voltage generated by coupling the first boosting circuit and the second boosting circuit in series to a voltage output node at the first switching state and a second boosted voltage generated by coupling the first boosting circuit to the voltage output node and disconnecting the second boosting circuit from each of the first boosting circuit and the voltage output node at the second switching state, and
the first and second boosting circuits being such that, at least when the switching circuit takes a switching state, a capacitor of the first boosting circuit is coupled to the voltage output node and a capacitor of the second boosting circuit is disconnected from each of the voltage output node and the capacitor of the first boosting circuit.

9. The method of claim 8, further comprising a first external voltage terminal to be supplied with the first voltage, the first external voltage terminal coupled to the first voltage terminal.

10. The method of claim 9, further comprising a second external voltage terminal to be supplied with a third voltage and an internal voltage generator coupled to the second external voltage terminal to also be supplied with the third voltage and configured to generate the second voltage at the second voltage terminal.

11. The method of claim 10, wherein the third voltage is greater than the first voltage.

12. The method of claim 11, wherein the third voltage is greater than the second voltage.

13. The method of claim 8, wherein the second boosting circuit is configured to boost the first voltage supplied with the internal voltage node to generate a first boosting voltage and the first boosting circuit is configured to boost the first boosting voltage to generate at the voltage output node a second boosting voltage when the switching circuit takes the first switching state.

14. The method of claim 13, wherein the first boosting circuit is configured to boost the second voltage supplied with the internal voltage node to generate at the voltage output node a third boosting voltage when the switching circuit takes the second switching state.

* * * * *